(12) United States Patent
Almeida et al.

(10) Patent No.: US 11,953,554 B1
(45) Date of Patent: *Apr. 9, 2024

(54) REMOTE CONTROL DEVICE TESTING ENVIRONMENT

(71) Applicant: CSC Holdings, LLC, Bethpage, NY (US)

(72) Inventors: Heitor J. Almeida, Elmsford, NY (US); Bowen Song, Hicksville, NY (US); John Markowski, Smithtown, NY (US)

(73) Assignee: CSC Holdings, LLC, Bethpage, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/160,518

(22) Filed: Jan. 27, 2023

Related U.S. Application Data

(63) Continuation of application No. 16/209,014, filed on Dec. 4, 2018, now Pat. No. 11,579,196.

(51) Int. Cl.
  *G01R 31/28* (2006.01)
  *G01R 31/327* (2006.01)
  *G08C 17/00* (2006.01)

(52) U.S. Cl.
  CPC ..... *G01R 31/3277* (2013.01); *G01R 31/2834* (2013.01); *G08C 17/00* (2013.01)

(58) Field of Classification Search
  CPC ............. G06F 9/44505; G06F 11/3672; G06F 11/3688; G06F 11/368; G06F 11/3684;
  (Continued)

(56) References Cited

U.S. PATENT DOCUMENTS 5,671,273 A 9/1997 Lanquist
5,867,149 A 2/1999 Jaeger
(Continued)

FOREIGN PATENT DOCUMENTS

CN 201203654 Y 3/2009
JP H01288929 A 11/1989

OTHER PUBLICATIONS

JPH01288929A Terminal Device Checking System (Year: 1989).
Google translation of Hu et al. CN 201203654 Y Test system for remote controller, pp. 1-32 (Year: 2009).

*Primary Examiner* — Jermele M Hollington
*Assistant Examiner* — Courtney G McDonnough
(74) *Attorney, Agent, or Firm* — Sterne, Kessler, Goldstein & Fox P.L.L.C

(57) ABSTRACT

A remote control device testing environment evaluates operational performance of physical implementations of remote control devices. This operational performance of the physical implementations of the remote control devices allows the integrated circuits of the remote control devices as well as integrated circuit interfaces electrically coupling these integrated circuits to each other to be evaluated. Additionally, the interconnection, such as electrical coupling to provide an example, between these integrated circuits and/or the integrated circuit interfaces can be evaluated which otherwise would not be evaluated by software simulation alone. Moreover, the evaluating of this operational performance of the physical implementations of the remote control devices allows these remote control devices to be in evaluated in a real world environment with exposure to various environmental factors, such as temperature, humidity, and/or electromagnetic interference to provide some examples. Furthermore, the evaluating of this operational performance of the physical implementations of the remote
(Continued)

control devices allows interactions between these remote control devices and other electronic devices to be evaluated.

20 Claims, 6 Drawing Sheets

(58) Field of Classification Search
CPC ....... G06F 9/44; G01R 31/01; G01R 31/2834; G01R 31/3277; H04N 21/42204
USPC .......................................................... 324/415
See application file for complete search history.

(56) References Cited

U.S. PATENT DOCUMENTS

| | | |
|---|---|---|
| 6,933,833 B1 | 8/2005 | Darbee |
| 2010/0268994 A1 | 10/2010 | Chang |
| 2014/0197857 A1 | 7/2014 | Partee |
| 2014/0320670 A1 | 10/2014 | Wang et al. |
| 2017/0140883 A1 | 5/2017 | Kitamura et al. |

REMOTE CONTROL DEVICE TESTING ENVIRONMENT

CROSS REFERENCE TO RELATED APPLICATIONS

This application is a continuation of U.S. patent application Ser. No. 16/209,014, filed Dec. 4, 2018, now U.S. Pat. No. 11,579,196, which is hereby incorporated by reference in its entirety.

BACKGROUND

Advances in technology and engineering have allowed designers and manufacturers to offer more sophisticated electronic devices to consumers. The development of the remote control has allowed these electronic devices to be wirelessly controlled by the consumers. The remote control has evolved from controlling simple operations, such as adjustment of the volume of these electronic devices and/or the programming being output by these electronic devices to provide some examples, to include more complex operations, such as textual searching and/or audible voice commands to provide some examples. The remote control has progressed from having programming channel and/or volume selectors to control these simple operations to include an alphabetical, a numeric, or an alphamerical keypad for entering alphanumeric characters, and/or one or more data pads to control these more complex operations. Moreover, the remote control has further evolved with the introduction of the Internet of Things (IoT). The Internet of Things (IoT) represents an ever-growing inter-network of physical devices, vehicles, buildings, and/or other items that are embedded with electronics, software, sensors, actuators, and network connectivity which enable these devices, vehicles, buildings, and/or other items to exchange data. The remote control has advance to even allow these devices, vehicles, buildings, and/or other items to be wirelessly controlled by the consumers.

BRIEF DESCRIPTION OF THE DRAWINGS/FIGURES

The present disclosure is described with reference to the accompanying drawings. In the drawings, like reference numbers indicate identical or functionally similar elements. Additionally, the left most digit(s) of a reference number identifies the drawing in which the reference number first appears. In the accompanying drawings.

Figure 5A:
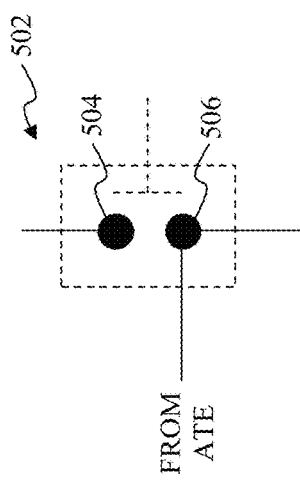
Figure 5A:
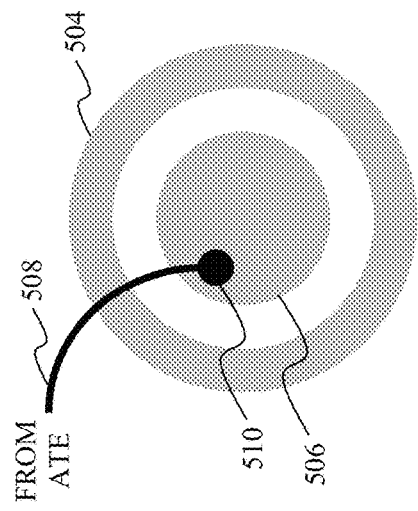
Figure 5B:
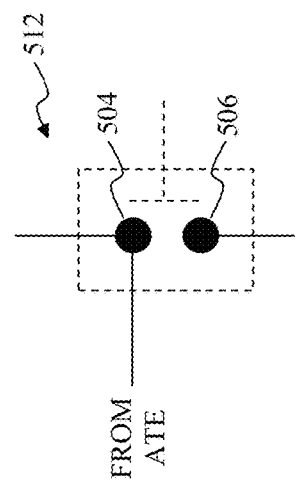
Figure 5B:
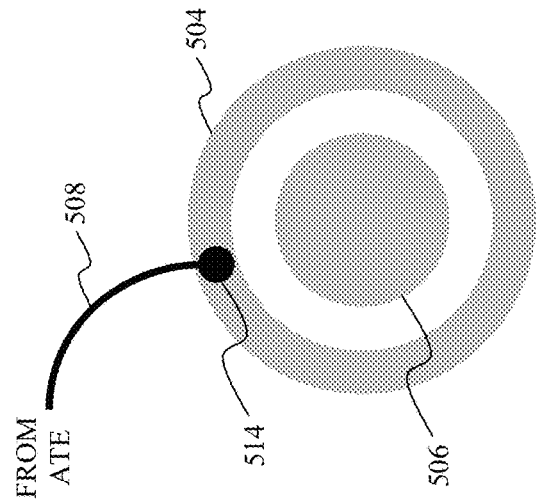
Figure 6:
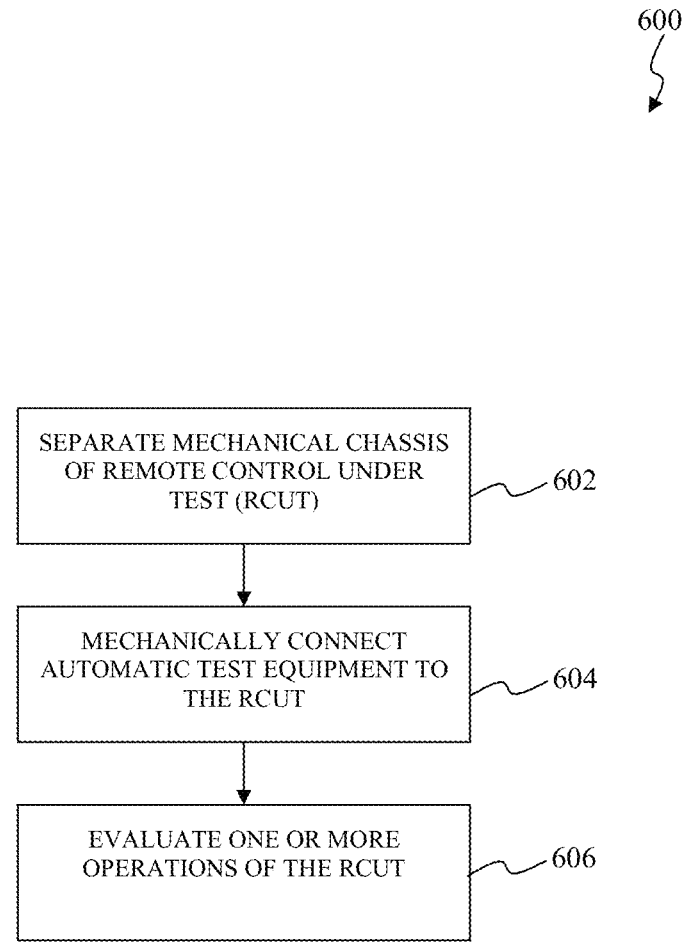

FIG. 4A through 4D graphically illustrate exemplary various first and second switching contacts of various mechanical push button switches within the exemplary remote control under test (RCUT) according to exemplary embodiments of the present disclosures;

FIG. 5A through 5B graphically illustrate exemplary electrical activations of various mechanical push button switches within the exemplary remote control under test (RCUT) according to exemplary embodiments of the present disclosure; and FIG. 6 illustrates a flowchart of an exemplary operation of the remote control device testing environment according to an exemplary embodiment of the present disclosure.

The present disclosure will now be described with reference to the accompanying drawings.

DETAILED DESCRIPTION OF THE DISCLOSURE

Overview

A remote control device testing environment evaluates operational performance of physical implementations of remote control devices. This operational performance of the physical implementations of the remote control devices allows the integrated circuits of the remote control devices as well as integrated circuit interfaces electrically coupling these integrated circuits to each other to be evaluated. Additionally, the interconnection, such as electrical coupling to provide an example, between these integrated circuits and/or the integrated circuit interfaces can be evaluated which otherwise would not be evaluated by software simulation alone. Moreover, the evaluating of this operational performance of the physical implementations of the remote control devices allows these remote control devices to be in evaluated in a real world environment with exposure to various environmental factors, such as temperature, humidity, and/or electromagnetic interference to provide some examples. Furthermore, the evaluating of this operational performance of the physical implementations of the remote control devices allows interactions between these remote control devices and other electronic devices to be evaluated.

Exemplary Smart Home Environment

Figure 1:
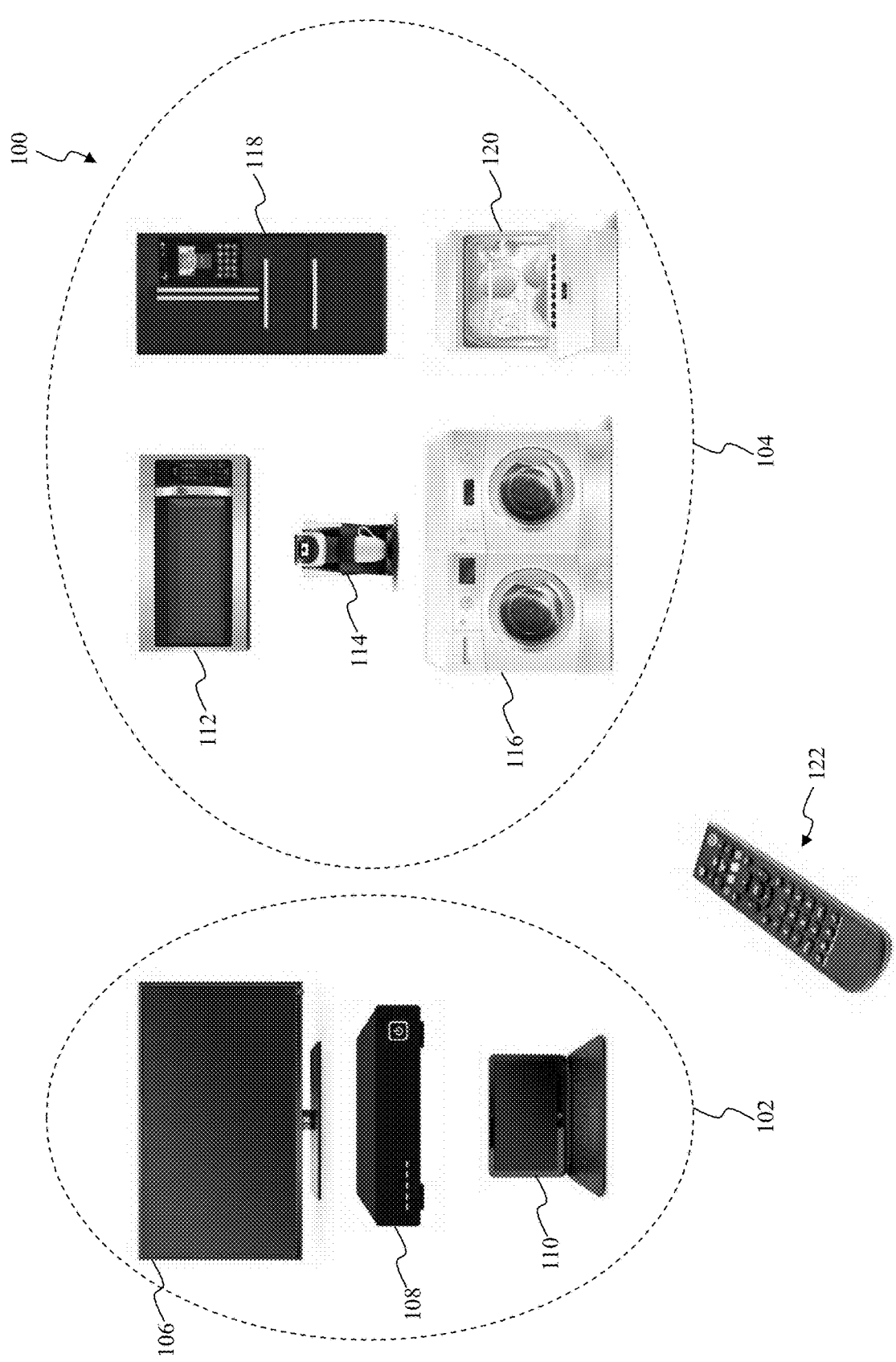
FIG. 1 illustrates a block diagram of an exemplary smart home environment according to an embodiment of the present disclosure.

FIG. 1 illustrates a block diagram of an exemplary smart home environment according to an embodiment of the present disclosure. In the exemplary embodiment illustrated in FIG. 1, a smart home environment 100 represents a residential building structure having one or more electronic devices. Those skilled in the relevant art(s) will recognize the one or more electronic devices can be similarly included within other residential building structures and/or non-building structures as well as to industrial, and/or commercial building structures and/or non-building structures without departing from the spirit and scope of the present disclosure. As illustrated in FIG. 1, the one or more electronic devices can include one or more media electronic devices 102 and/or one or more non-media electronic devices 104.

In the exemplary embodiment illustrated in FIG. 1, the one or more media electronic devices 102 functionally cooperate to present media to an audience. Generally, the one or more media electronic devices 102 functionally cooperate to manipulate audio, video, and/or data associated with the media for presentation to the audience. As illustrated in FIG. 1, the one or more media electronic devices 102 can include one or more display devices 106, such as one or more televisions and/or one or more monitors, one or more set-top boxes 108, and/or one or more computing devices 110, such as one or more laptop computers, one or more notebook computers, one or more tablet computing devices, and/or one or more smartphones. Although not illustrated in FIG. 1, the one or more media electronic devices 102 can include other electronic devices, such as one or more digital video disc (DVD) devices and/or one or more audio/video (AV) receivers to provide some examples, that similarly functionally cooperate to present the media without departing from the spirit and scope of the present disclosure.

In the exemplary embodiment illustrated in FIG. 1, the one or more non-media electronic devices 104 represent other electronic devices within the smart home environment 100. As illustrated in FIG. 1, the one or more non-media electronic devices 104 can include one or more consumer electronic devices, such as one or more microwave ovens 112, one or more table top appliance devices 114, one or more washer/dryers 116, one or more refrigerators 118, and/or one or more dishwashers 120 to provide some examples. In an exemplary embodiment, the one or more non-media electronic devices 104 can be implemented as an inter-network of physical devices that are embedded with electronics, software, and/or network connectivity which enable these devices to exchange data.

As illustrated in FIG. 1, the smart home environment 100 further includes one or more remote control devices 122 for remotely controlling one or more operations of the one or more media electronic devices 102 and/or the one or more non-media electronic devices 104. In an exemplary embodiment, the one or more remote control devices 122 can execute one or more software applications to remotely control operation of the one or more media electronic devices 102 and/or the one or more non-media electronic devices 104. In the exemplary embodiment illustrated in FIG. 1, the one or more remote control devices 122 communicate one or more digitally-coded pulses of infrared radiation to control the operation of the one or more media electronic devices 102 and/or the one or more non-media electronic devices 104. However, the one or more remote control devices 122 can utilize other mechanisms, such as Bluetooth™, near field communication (NFC), one or more personal area networks (PANs), one or more local area networks (LANs), and/or one or more wide area networks (WANs) to provide some examples, to control the operation of the one or more media electronic devices 102 and/or the one or more non-media electronic devices 104 without departing from the spirit and scope of the present disclosure. In some situations, the one or more remote control devices 122 undergo a handshaking procedure, referred to as pairing, to establish communication with the one or more media electronic devices 102 and/or the one or more non-media electronic devices 104. This handshaking procedure establishes one or more communication links between the one or more remote control devices 122 and the one or more media electronic devices 102 and/or the one or more non-media electronic devices 104 for controlling the one or more operations of these devices.

In the exemplary embodiment illustrated in FIG. 1, the one or more remote control devices 122 include multiple mechanical push button switches for remotely controlling the operation of the one or more media electronic devices 102 and/or the one or more non-media electronic devices 104. The multiple mechanical push button switches can be used to control one or more simple operations of the one or more media electronic devices 102 and/or the one or more non-media electronic devices 104, such as the volume of the one or more display devices 106 and/or the one or more computing devices 110 and/or the programming being output by the one or more set-top boxes 108 and/or the one or more computing devices 110 to provide some examples. However, the multiple mechanical push button switches can be used to control other complex operations, such as textual searching to provide an example, which will be recognized by those skilled in the relevant art(s) without departing from the spirit and scope of the present disclosure. In some situations, the multiple mechanical push button switches can additionally be used to control operation of the one or more remote control devices 122 themselves, for example, enabling the one or more remote control devices 122 to receive one or more audible voice commands to control the one or more operations of the one or more media electronic devices 102 and/or the one or more non-media electronic devices 104 to provide an example.

Also, in the exemplary embodiment illustrated in FIG. 1, the one or more remote control devices 122 include multiple integrated circuits, also referred to as chips, which functionally cooperate to control the operation of the one or more media electronic devices 102 and/or the one or more non-media electronic devices 104. These integrated circuits can include one or more physical layer (PHY) devices to communicate with the one or more media electronic devices 102 and/or the one or more non-media electronic devices 104, one or more memory devices to store information related to controlling the one or more media electronic devices 102 and/or the one or more non-media electronic devices 104, and/or one or more processors to control overall configuration and operation of the one or more remote control devices 122. In some situations, the one or more remote control devices 122 also include multiple integrated circuit interfaces to electrically couple these integrated circuits. In an exemplary embodiment, the multiple integrated circuit interfaces are implemented using planar waveguides, such as stripline or microstrip to provide some examples, to electrically couple these integrated circuits. In the exemplary embodiment illustrated in FIG. 1, the one or more remote control devices 122 further include one or more electric batteries to supply operational power to these multiple integrated circuits. The one or more electric batteries can be implemented using one or more primary batteries, often referred to as single-use or disposable batteries, one or more secondary batteries, also referred to as rechargeable batteries, and/or any combination of the one or more primary batteries and/or the one or more secondary batteries that will be apparent to those skilled in the relevant art(s) without departing from the spirit and scope of the present disclosure. The one or more remote control devices 122 dissipate electrochemical energy stored in the one or more electric batteries as the one or more remote control devices 122 control operations of the one or more media electronic devices 102 and/or the one or more non-media electronic devices 104.

Exemplary Remote Control Device Testing Environment

Figure 2:
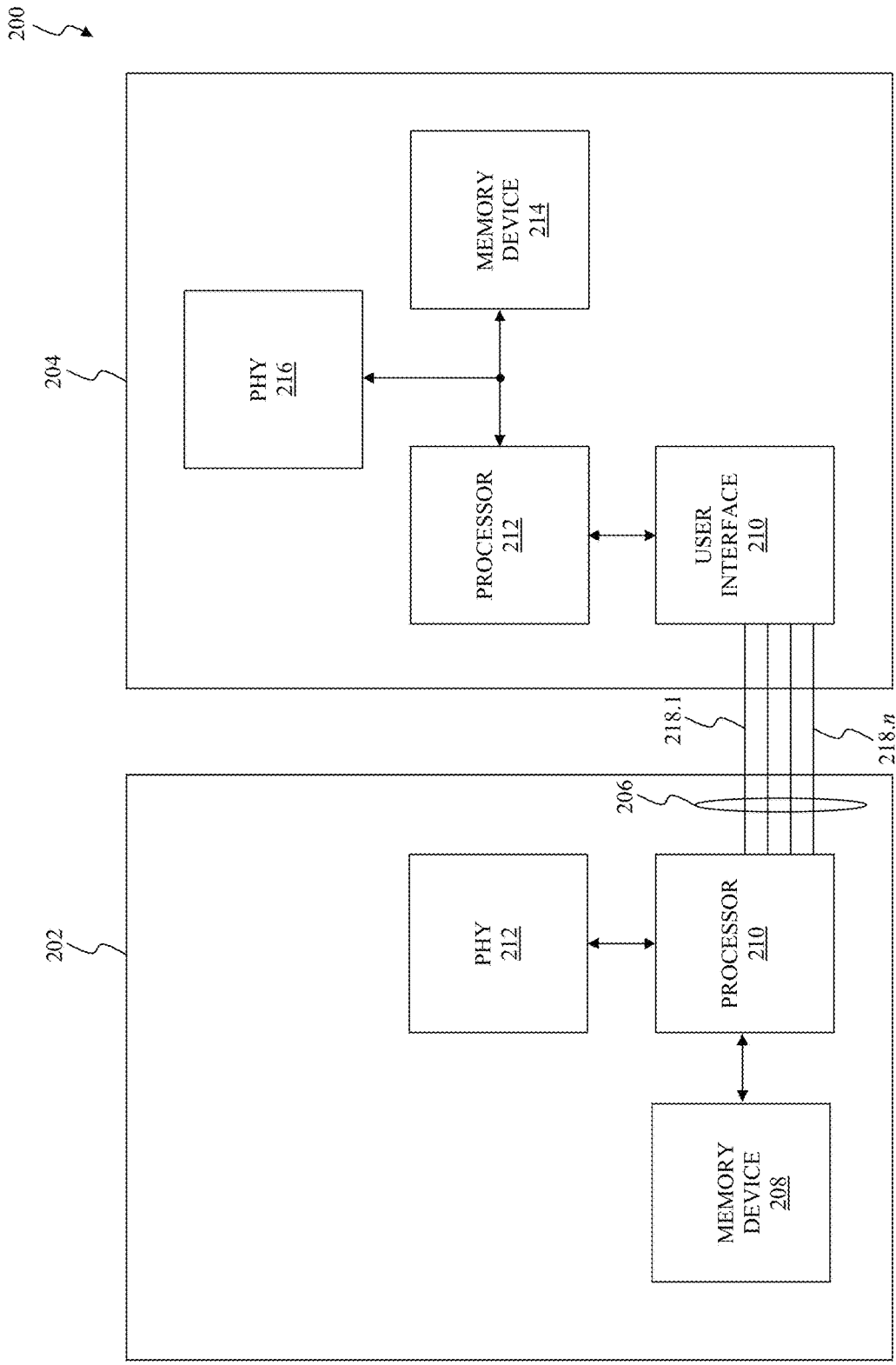
FIG. 2 illustrates a block diagram of an exemplary remote control device testing environment according to an embodiment of the present disclosure.

FIG. 2 illustrates a block diagram of an exemplary remote control device testing environment according to an embodiment of the present disclosure. As to be described in further detail below, a remote control device testing environment 200 evaluates operational performance of physical implementations of remote control devices as opposed to software simulations of their operational performance. This operational performance of the physical implementations of the remote control devices allows the integrated circuits of the remote control devices as well as integrated circuit interfaces electrically coupling these integrated circuits to each other to be evaluated. Additionally, the interconnection, such as electrical coupling to provide an example, between these integrated circuits and/or the integrated circuit interfaces can be evaluated which otherwise would not be evaluated by software simulation alone. Moreover, the evaluating of this operational performance of the physical implementations of the remote control devices allows these remote control devices to be in evaluated in a real world environment with exposure to various environmental factors, such as temperature, humidity, and/or electromagnetic interference to provide some examples. Furthermore, the evaluating of this operational performance of the physical implementations of the remote control devices allows interactions between these remote control devices and other electronic devices, such as the one or more media electronic devices 102 and/or the one or more non-media electronic devices 104 as described above in FIG. 1, to be evaluated. As illustrated in FIG. 2, the remote control device testing environment 200 includes automatic test equipment (ATE), also referred to as automated test equipment, 202 and a remote control under test (RCUT) 204 which are mechanically and electrically connected to each other using an evaluation interface 206. The remote control device 200 can represent an exemplary embodiment of one or more of the remote control devices 122 as described above in FIG. 1.

In the exemplary embodiment illustrated in FIG. 2, the ATE 202 evaluates operational performance of hardware and/or software of the RCUT 204. As to be described in further detail below, the ATE 202 executes a testing script to control the overall configuration and/or operation of the RCUT 204 to cause the RCUT 204 to perform one or more operations. In an exemplary embodiment, the testing script, when executed by the ATE 202, causes the RCUT 204 to electrically, as opposed to mechanically, activate one or more mechanical push button switches of the RCUT 204 to cause the RCUT 204 to perform the one or more operations. In this exemplary embodiment, this electrical activation of the one or more mechanical push button switches simulates physical activation, for example, pushing, of the one or more mechanical push button switches by a user of the RCUT 204. Thereafter, the ATE 202, when executing the testing script, can measure the operational performance of the hardware and/or the software of the RCUT 204 in performing the one or more operations. As illustrated in FIG. 2, the ATE 202 includes a memory device 208, a processor 210, and a physical layer interface (PHY) 212.

In the exemplary embodiment illustrated in FIG. 2, the memory device 208 stores the testing script to control the overall configuration and/or operation of the RCUT 204. The memory device 208 can be implemented as a volatile memory storage device, such as a random-access memory (RAM) storage device to provide an example, which requires power to maintain the electronic data, or a non-volatile memory storage device, such as a read-only memory (ROM) storage device to provide an example, which can maintain the electronic data even when not powered. The RAM storage device can be implemented in a dynamic random-access memory (DRAM), a static random-access memory (SRAM), and/or a non-volatile random-access memory (NVRAM), often referred to as a flash memory, configuration to provide some examples. The ROM storage device can be implemented in programmable read-only memory (PROM), a one-time programmable ROM (OTP), an erasable programmable read-only memory (EPROM) and/or an electrically erasable programmable read-only memory (EEPROM) configuration to provide some examples.

The testing script represents a sequence of instructions and/or one or more parameters to be used by the sequence of instructions to evaluate the operational performance of the hardware and/or the software of the RCUT 204. For example, the one or more parameters can indicate one or more mechanical push button switches from among the multiple mechanical push button switches of the RCUT 204 are to be activated. In this example, the sequence of instructions can cause the processor 210, which is to be described in further detail below, to activate the one or more mechanical push button switches in accordance with the one or more parameters to cause the RCUT 204 to perform the one or more operations. In an exemplary embodiment, the multiple mechanical push button switches of the RCUT 204 can include one or more mechanical push button switches associated with one or more electronic devices, such as one or more of the one or more media electronic devices 102 and/or the one or more non-media electronic devices 104 as described in FIG. 1 to provide some examples. In this exemplary embodiment, the sequence of instructions can cause the processor 210, which is to be described in further detail below, to activate the one or more mechanical push button switches associated with the one or more electronic devices to allow the processor 210 to evaluate a handshaking procedure, referred to as pairing, between the RCUT 204 and the one or more electronic devices.

Furthermore, the memory device 208 can store a software application to be executed by the RCUT 204. In an exemplary embodiment, the software application is specifically designed to perform a group of coordinated functions, tasks, operations and/or procedures. In some situations, this software application can be stored in a high-level programming language, such as the JavaScript and the C programming language to provide some examples. In these situations, the memory device 208 can further store a complier, which when executed by the processor 210, allows the software application stored in the high-level programming language to be translated to a low-level programming language, such as machine code or assembly language to provide some examples, for execution by the RCUT 204. This allows the software application to be executed by the RCUT 204 to be changed, for example, optimized, on-the-fly while the ATE 202 evaluates the operational performance of the RCUT 204.

The processor 210 executes the testing script stored in the memory device 208 to cause the RCUT 204 to evaluate the operational performance of the hardware and/or the software of the RCUT 204. In the exemplary embodiment illustrated in FIG. 2, the processor 210 executes the sequence of instructions specified by the testing script and/or the sequence of instructions in accordance with the parameters specified by the testing script to cause the hardware and/or the software of the RCUT 204 to perform the one or more operations. The processor 210, when executing the testing script, selectively electrically activates one or more mechanical push button switches from among the multiple mechanical push button switches of the RCUT 204 to cause the RCUT 204 to perform the one or more operations. In an exemplary embodiment, the processor 210 sends one or more electrical signals, such as one or more electrical pulses to provide an example, to the one or more mechanical push button switches to activate these mechanical push button switches. The one or more electrical signals simulate physical activation, for example, pushing, of the one or more mechanical push button switches by a user of the RCUT 204.

The processor 210, while executing the testing script, can measure one or more characteristics, parameters, and/or attributes associated with the operational performance of the hardware and/or the software of the RCUT 204 in performing the one or more operations. In some situations, as described above, the testing script, when executed by the processor 210, can evaluate interactions between the RCUT 204 and other electronic devices, such as the one or more media electronic devices 102 and/or the one or more non-media electronic devices 104 as described above in FIG. 1.

In these situations, the processor 210 can measure a length of time, referred to as button press speed, necessary for the one or more mechanical push button switches to be activated before one or more commands associated with the one or more mechanical push button switches are received by these other electronic devices. Moreover, the processor 210, while executing the testing script, can evaluate the operational performance of the hardware and/or the software of the RCUT 204 under extensive usage or loading to ensure the software application of the RCUT 204 continues to function properly, namely, does not exit, hang, or freeze to provide some examples. In an exemplary embodiment, the processor 210, while executing the testing script, can electrically activate the one or more mechanical push button switches more times per second when compared to conventional testing of physically activating the one or more mechanical push button switches by physically depressing the one or more mechanical push button switches. For example, the processor 210, while executing the testing script, can electrically activate the one or more mechanical push button switches hundreds or even thousands of times per second as compared to tens of times per second if the one or more mechanical push button switches were physically activated by physically depressing the one or more mechanical push button switches. Furthermore, the RCUT 204 can include one or more electric batteries as described above in FIG. 1. And as described above in FIG. 1, the RCUT 204 dissipates electrochemical energy stored in the one or more electric batteries as the one or more remote control devices 122 control operations of the other electronic devices. The processor 210, while executing the testing script, can measure a duration in time, referred to as battery-life, before the one or more electric batteries need replacing and/or recharging.

Thereafter, the processor 210 can compare the one or more characteristics, parameters, and/or attributes associated with the operational performance of the hardware and/or the software of the RCUT 204 with an electrical design specification to ensure the one or more characteristics, parameters, and/or attributes associated with the operational performance of the hardware and/or the software of the RCUT 204 satisfies operational performance for these operations as outlined in the electrical design specification. For example, the processor 210 can compare the measured button press speed as described above with a button press speed as outlined in the electrical design specification to ensure the measured button press speed satisfies the button press speed as outlined in the electrical design specification. As another example, the processor 210 can compare the measured battery-life with a battery-life as outlined in the electrical design specification to ensure the measured battery-life, satisfies the battery-life as outlined in the electrical design specification. Moreover, the processor 210, when executing the testing script, can provide an indication of whether the RCUT 204 operates as expected, namely, the performance of the one or more operations satisfies the operational performance for these operations as outlined in the electrical design specification. Alternatively, or in addition to, in these situations, the processor 210, when executing the testing script, can provide an indication of whether the RCUT 204 operates unexpectedly, namely, the performance of the one or more operations does not satisfy the operational performance for these operations as outlined in the electrical design specification.

The PHY 212 provides a wireless interface between the ATE 202 and the RCUT 204 for wirelessly communicating information between the ATE 202 and the RCUT 204. In an exemplary embodiment, this wireless interface is implemented in accordance with one or more wireless networking communication standards or protocols, such as a version of an Institute of Electrical and Electronics Engineers (I.E.E.E.) 802.11 communication standard, for example, 802.11a, 802.11b/g/n, 802.11h, and/or 802.11ac which are collectively referred to as Wi-Fi, an I.E.E.E. 802.16 communication standard, also referred to as WiMax, a version of a Bluetooth communication standard, a version of a ZigBee communication standard, a version of a Z-Wave communication standard, a version of a IPv6 over Low power Wireless Personal Area Networks (6LoWPAN) communication standard, a version of Insteon, an ISO/IEC 14543-3-10 communication standard, also referred to as EnOcean, and/or or any other wireless communication standard or protocol that will be apparent to those skilled in the relevant art(s) without departing from the spirit and scope of the present disclosure. For example, the PHY 212 can communicate the software application to be executed by the RCUT 204 stored within the memory device 208 to the RCUT 204 for installation within the RCUT 204.

In the exemplary embodiment illustrated in FIG. 2, the one or more mechanical push button switches of the RCUT 204 are mechanically and electrically connected to the ATE 202. This electrical activation of the one or more mechanical push button switches simulates physical activation, for example, pushing, of the one or more mechanical push button switches by the user of the RCUT 204. The one or more mechanical push button switches, in response to being electrically activated by the ATE 202 executing the testing script, perform the one or more operations to be evaluated by the ATE 202 as described above. As illustrated in FIG. 2, the RCUT 204 includes a user interface 210, a processor 212, a memory device 214, and a physical layer interface (PHY) 216.

The user interface 210 includes the one or more mechanical push button switches which are selectively chosen from multiple mechanical push button switches. In the exemplary embodiment illustrated in FIG. 2, the multiple mechanical push button switches can be associated with one or more simple operations, such as adjustment of the volume of the other electronic devices and/or the programming being output by the other electronic devices to provide some examples. However, the multiple mechanical push button switches can be associated with one or more other complex operations, such as textual searching to provide an example, which will be recognized by those skilled in the relevant art(s) without departing from the spirit and scope of the present disclosure. The one or more mechanical push button switches can include one or more power buttons, one or more device selection buttons to remotely select one or more electronic devices, such as one or more of the one or more media electronic devices 102 and/or the one or more non-media electronic devices 104 as described above in FIG. 1 for control, one or more programming channel and/or volume selectors, an alphabetical, a numeric, or an alphamerical keypad for entering alphanumeric characters, and/or one or more data pads for navigating menus on the one or more electronic devices.

In an exemplary embodiment, the multiple mechanical push button switches include first switching contacts, second switching contacts, third switching contacts, and actuators. In this exemplary embodiment, the multiple mechanical push button switches can be physically activated by pushing on the actuators. This pushing of the actuators displaces the third switching contacts in such a manner to be in mechanical contact with the first switching contacts and the second switching contacts to electrically connect the first switching contacts and the second switching contacts to each other. In this situation, the multiple mechanical push button switches can be characterized as being physically activated to allow one or more electrical signals to pass between the first switching contacts and the second switching contacts onto the processor 212 for further analysis. In the exemplary embodiment illustrated in FIG. 2, the ATE 202 is mechanically and electrically connected to the first switching contacts and/or the second switching contacts. The ATE 202 can electrically activate a corresponding mechanical push button switch of the multiple mechanical push button switches by sending the one or more electrical signals, as described above, to the first switching contact and/or the second switching contact of the corresponding mechanical push button switch to simulate the physical pushing of the actuator of the corresponding mechanical push button switch.

The processor 212 controls the overall configuration and operation of the RCUT 204. In the exemplary embodiment illustrated in FIG. 2, the processor 212 can execute a software application stored in the memory device 214 to configure the configuration and operation of the RCUT 204. In some situations, this software application can be provided by the ATE 202 and stored in the memory device 214. In an exemplary embodiment, the software application can be associated with a mapping of the multiple mechanical push button switches to one or more operations to be performed by the RCUT 204. In this exemplary embodiment, the processor 212, when executing the software application, can receive one or more electrical signals from the ATE 202 via the first switching contact and/or the second switching contact of a corresponding mechanical push button switch from among the mechanical push button switches. In this exemplary embodiment, the processor 212 can determine one or more corresponding operations, such as one or more commands to provide an example, associated with the corresponding mechanical push button switch from the mapping of the multiple mechanical push button switches. Thereafter, the processor 212 can cause the RCUT 204 to perform the one or more corresponding operations associated with the corresponding mechanical push button switch. For example, the processor 212, when executing the software application, can receive one or more electrical signals from the ATE 202 via the first switching contact and/or the second switching contact of a <volume up> mechanical push button switch or a <volume down> mechanical push button switch. In this exemplary embodiment, the processor 212 can determine a <volume up> command or a <volume down> command from the mapping of the multiple mechanical push button switches. Thereafter, the processor 212 can cause the RCUT 204 to provide the <volume up> command or the <volume down> command provide to a display device, such as one of the one or more display devices 106 as described above in FIG. 1, to increase or decrease an audio output volume of the display device.

The memory device 214 can store the software application to be executed by the RCUT 204. In an exemplary embodiment, the software application represents a software application which is specifically designed to perform a group of coordinated functions, tasks, operations and/or procedures. In some situations, this software application can be stored in a high-level programming language, such as the JavaScript and the C programming language to provide some examples, and/or a low-level programming language, such as machine code or assembly language to provide some examples, for execution by the RCUT 204.

The PHY 216 provides a wireless interface between the ATE 202 and the RCUT 204 for wirelessly communicating information between the ATE 202 and the RCUT 204. In an exemplary embodiment, this wireless interface is implemented in accordance with one or more wireless networking communication standards or protocols, such as a version of an Institute of Electrical and Electronics Engineers (I.E.E.E.) 802.11 communication standard, for example, 802.11a, 802.11b/g/n, 802.11h, and/or 802.11ac which are collectively referred to as Wi-Fi, an I.E.E.E. 802.16 communication standard, also referred to as WiMax, a version of a Bluetooth communication standard, a version of a ZigBee communication standard, a version of a Z-Wave communication standard, a version of a IPv6 over Low power Wireless Personal Area Networks (6LoWPAN) communication standard, a version of Insteon, an ISO/IEC 14543-3-10 communication standard, also referred to as EnOcean, and/or or any other wireless communication standard or protocol that will be apparent to those skilled in the relevant art(s) without departing from the spirit and scope of the present disclosure. For example, the PHY 216 can communicate one or more commands to other electronic devices, such as the one or more media electronic devices 102 and/or the one or more non-media electronic devices 104 as described above in FIG. 1, to cause the other electronic devices to perform the one or more corresponding operations associated with the electrically activated mechanical push button switches.

The evaluation interface 206 represents a hardwired interface between the ATE 202 and the RCUT 204. As illustrated in FIG. 2, the evaluation interface 206 includes wired communication links 218.1 through 218.n. The wired communication links 218.1 through 218.n can be implemented using one or more coaxial cables, flexible cables, heliax cables, non-metallic sheathed cables, metallic sheathed cables, multicore cables, paired cables, ribbon cables, shielded cables, single cables, twinaxal cables, twin-lead cables, twisted pair cables, and/or any other suitable configuration of electrical conductors suitable for carrying electric signals that will be apparent to those skilled in the relevant art(s) without departing from the spirit and scope of the present disclosure. In the exemplary embodiment illustrated in FIG. 2, the wired communication links 218.1 through 218.n are mechanically and electrically connected to the multiple mechanical push button switches of the user interface 210 as described above. For example, the wired communication links 218.1 through 218.n can be directly soldered to the first switching contacts and/or the second switching contacts of the multiple mechanical push button switches as described above allowing one or more electrical signals to pass from the ATE 202 to the first switching contacts and/or the second switching contacts of the multiple mechanical push button switches and onto the processor 212 for further processing. Those skilled in the art(s) will recognize other mechanisms, such as silver conductive epoxy to provide an example, are possible for mechanically and electrically coupling the wired communication links 218.1 through 218.n to the first switching contacts and/or the second switching contacts of the multiple mechanical push button switches of the user interface 210.

Figure 3:
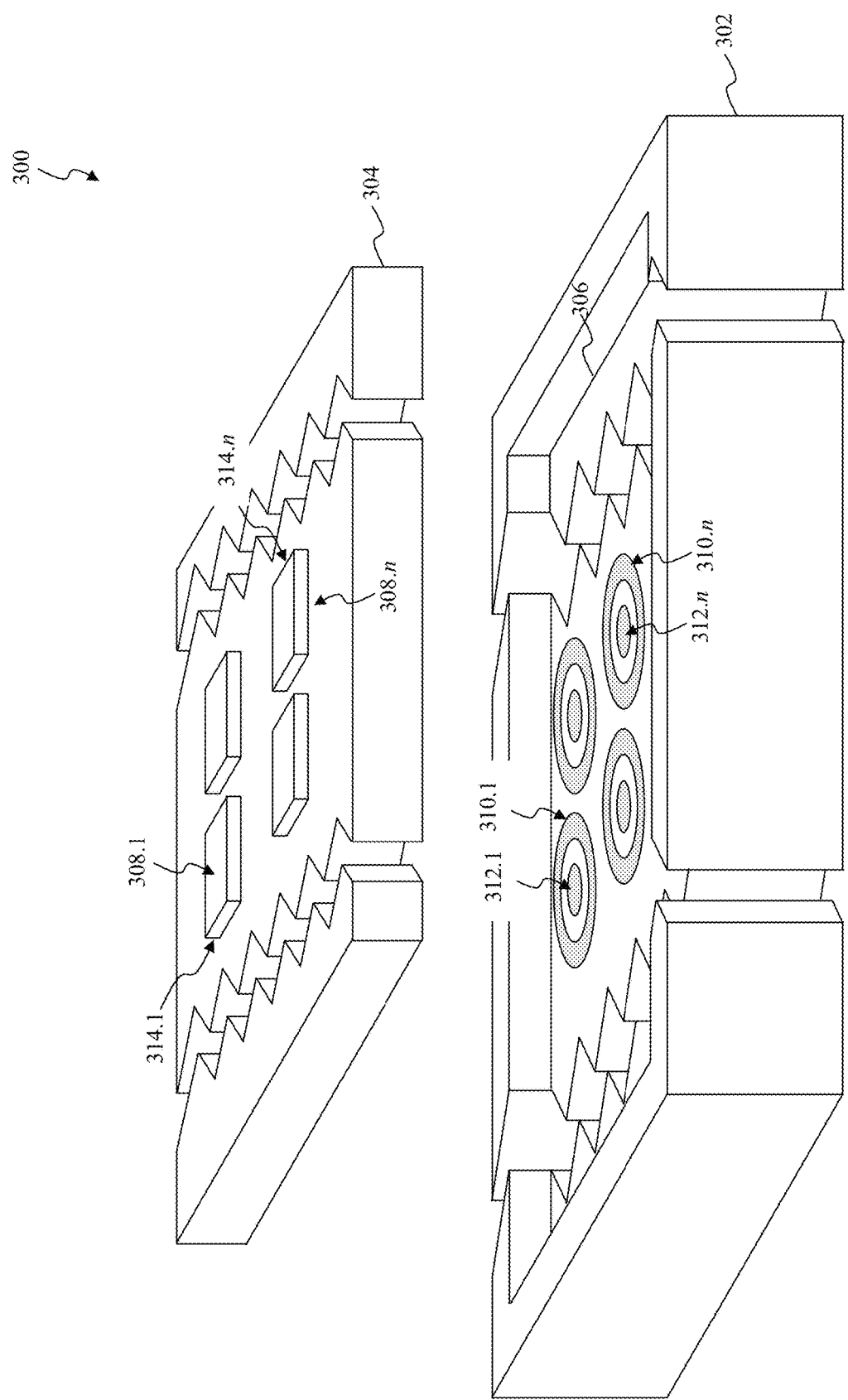
FIG. 3 illustrates an exemplary remote control under test (RCUT) that can be implemented within the exemplary remote control device testing environment according to an exemplary embodiment of the present disclosure.

Exemplary Remote Control Under Test (RCUT) that can be Implemented within the Exemplary Remote Control Device Testing Environment FIG. 3 illustrates an exemplary remote control under test (RCUT) that can be implemented within the exemplary remote control device testing environment according to an exemplary embodiment of the present disclosure. As illustrated in FIG. 3, a remote control device 300 includes hardware and/or software for remotely controlling one or more operations of one or more electronic devices, such as the one or more media electronic devices 102 and/or the one or more non-media electronic devices 104 as described above in FIG. 1. In the exemplary embodiment illustrated in FIG. 3, the remote control device 300 includes multiple mechanical push button switches for remotely controlling the operation of the one or more electronic devices. The multiple mechanical push button switches can be used to control one or more simple operations and/or other complex operations of the one or more electronic devices which will be recognized by those skilled in the relevant art(s) without departing from the spirit and scope of the present disclosure. As illustrated in FIG. 3, the remote control device 300 includes a first mechanical chassis 302 and a second mechanical chassis 304. In the exemplary embodiment illustrated in FIG. 3, the first mechanical chassis 302 is shown as being displaced from the first mechanical chassis 304 to better illustrate the remote control device 300. The remote control device 300 can represent an exemplary embodiment of one or more of the one or more remote control devices 122 as described above in FIG. 1 and/or the remote control device 200 as described above in FIG. 2.

The first mechanical chassis 302 and the second mechanical chassis 304 represent a foundation for assembling the electrical, the mechanical, and/or the electro-mechanical components of the remote control device 300. In the exemplary embodiment illustrated in FIG. 3, the first mechanical chassis 302 and the second mechanical chassis 304 provide a mechanism for securing mechanical push button switches 308.1 through 308.n within the remote control device 300. As illustrated in FIG. 3, the mechanical push button switches 308.1 through 308.n can include first switching contacts 310.1 through 310.n, second switching contacts 312.1 through 312.n, third switching contacts (not illustrated in FIG. 3), and actuators 314.1 through 314.n.

As illustrated in FIG. 3, the first mechanical chassis 302 includes the first switching contacts 310.1 through 310.n and the second switching contacts 312.1 through 312.n and the second mechanical chassis 304 includes the third switching contacts and the actuators 314.1 through 314.n. Although the third switching contacts are not illustrated in FIG. 3, the third switching contacts are situated between the actuators 314.1 through 314.n and the first switching contacts 310.1 through 310.n and the second switching contacts 312.1 through 312.n in such a manner to physically activate the mechanical push button switches 308.1 through 308.n by pushing on the actuators 314.1 through 314.n. This pushing of the actuators 314.1 through 314.n displaces the third switching contacts in such a manner to be mechanically connected to the first switching contacts 310.1 through 310.n and the second switching contacts 312.1 through 312.n which electrically connects the first switching contacts 310.1 through 310.n and the second switching contacts 312.1 through 312.n. In this situation, the mechanical push button switches 308.1 through 308.n can be characterized as being physically activated to allow one or more electrical signals to pass between the first switching contacts 310.1 through 310.n and the second switching contacts 312.1 through 312.n.

Although the first switching contacts 310.1 through 310.n and the second switching contacts 312.1 through 312.n are illustrated as being concentric circles in FIG. 3, this is for illustrative purposes only. Those skilled in the relevant art(s) will recognize the first switching contacts 310.1 through 310.n and the second switching contacts 312.1 through 312.n can be implemented using any suitable regular geometric structures, such as regular circles, regular ellipses, regular polygons to provide some examples, irregular geometric structures such as irregular polygons, or any combination thereof to provide some examples, without departing from the spirit and scope of the present disclosure. Moreover, these regular geometric structures, irregular geometric structures, or the any combination thereof can represent closed structures and/or open structures as will be apparent to those skilled in the skilled in the relevant art(s) without departing from the spirit and scope of the present disclosure. Examples of which are to be described in further detail below in FIG. 4A through FIG. 4C.

Exemplary Mechanical Push Button Switches can be Implemented within the Exemplary Remote Control Under Test (RCUT)

FIG. 4A through 4D graphically illustrate exemplary various first and second switching contacts of various mechanical push button switches within the exemplary remote control under test (RCUT) according to exemplary embodiments of the present disclosures. As described above, these various mechanical push button switches can be electrically, as opposed to mechanically, activated in a substantially similar manner as described above in FIG. 1 through FIG. 3. In the exemplary embodiment illustrated in FIG. 4A through 4D, these various mechanical push button switches can represent exemplary embodiments of one or more of the mechanical push button switches 308.1 through 308.n as described above in FIG. 3.

Figure 4A:
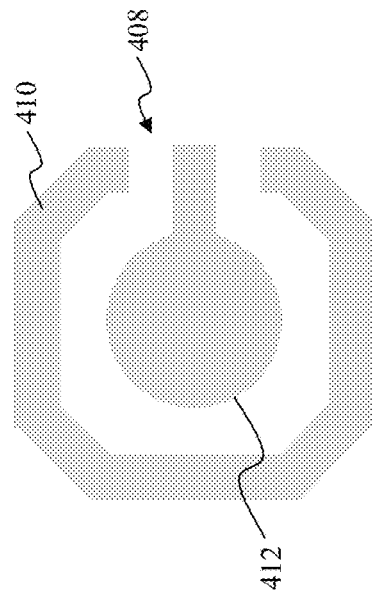
Figure 4B:
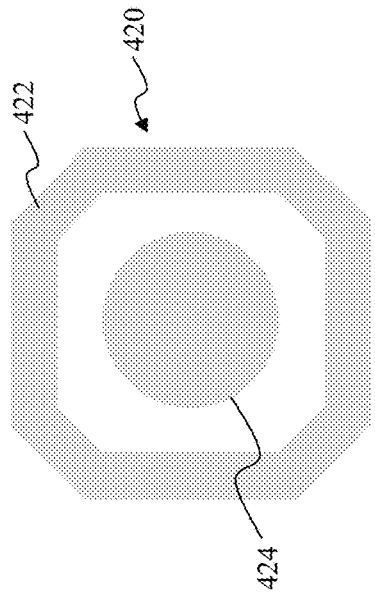
Figure 4C:
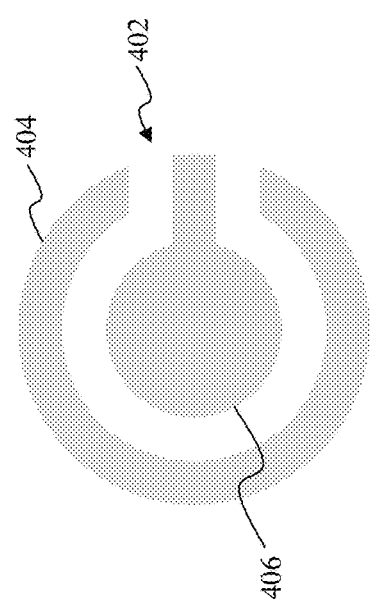
Figure 4D:
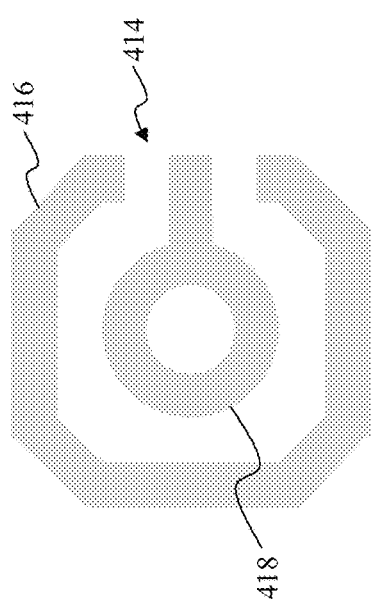

In the exemplary embodiment illustrated in FIG. 4A, a mechanical push button switch 402 includes a first switching contact 404 and a second switching contact 406. In this exemplary embodiment, the first switching contact 404 is implemented as an open regular geometric structure, such as an open regular circle to provide an example. The second switching contact 406, situated within the first switching contact 404, is implemented as a closed irregular geometric structure. As illustrated in FIG. 4A, this closed irregular geometric structure can be characterized as being a combination of a regular circle and a regular rectangle to provide an example. In the exemplary embodiment illustrated in FIG. 4B, a mechanical push button switch 408 includes a first switching contact 410 and a second switching contact 412. In this exemplary embodiment, the first switching contact 410 is implemented as an open regular geometric structure, such as an open regular polygon to provide an example. The second switching contact 412, situated within the first switching contact 410, is implemented as a closed irregular geometric structure. As illustrated in FIG. 4B, this closed irregular geometric structure can be characterized as being a combination of a regular circle and a regular rectangle to provide an example. In the exemplary embodiment illustrated in FIG. 4C, a mechanical push button switch 414 includes a first switching contact 416 and a second switching contact 418. In this exemplary embodiment, the first switching contact 416 is implemented as an open regular geometric structure, such as an open regular polygon to provide an example. The second switching contact 418, situated within the first switching contact 416, is implemented as an open irregular geometric structure. As illustrated in FIG. 4B, this open irregular geometric structure can be characterized as being a combination of a regular circle having an opening and a regular rectangle to provide an example. In the exemplary embodiment illustrated in FIG. 4D, a mechanical push button switch 420 includes a first switching contact 422 and a second switching contact 424. In this exemplary embodiment, the first switching contact 422 is implemented as a closed regular geometric structure, such as a closed regular polygon to provide an example. The second switching contact 424, situated within the first switching contact 422, is implemented as a closed geometric structure, such as a regular circle to provide an example.

Exemplary Electrical Activation of a Mechanical Push Button Switch within the Exemplary Remote Control Under Test (RCUT)

FIG. 5A through 5B graphically illustrate exemplary electrical activations of various mechanical push button switches within the exemplary remote control under test (RCUT) according to exemplary embodiments of the present disclosure. As described above, a remote control under test (RCUT), such as the RCUT 200 as described above in FIG. 2 and/or the RCUT 300 as described above in FIG. 3, includes one or more mechanical push button switches for remotely controlling one or more operations of one or more electronic devices, such as one or more of the one or more media electronic devices 102 and/or the one or more non-media electronic devices 104 as described above in FIG. 1. And as described above, the one or more mechanical push button switches include first switching contacts and second switching contacts, such as the first switching contacts 310.1 through 310.$n$ and/or the second switching contacts 312.1 through 312.$n$, respectively, to provide an example, which can be used to electrically, as opposed to mechanically, activate the one or more mechanical push button switches to cause the RCUT to perform the one or more operations.

FIG. 5A graphically illustrates an exemplary electrical activation of a mechanical push button switch 502. As illustrated in FIG. 5A, the mechanical push button switch 502 includes a first switching contact 504, a second switching contact 506, and a third contact having an actuator as described above. The third contact and the actuator are illustrated using a dashed line in FIG. 5A to denote the third contact and the actuator have been displaced, for example, removed, from the mechanical push button switch 502 to expose the first switching contact 504 and the second switching contact 506. In the exemplary embodiment illustrated in FIG. 5A, the mechanical push button switch 502 can be electrically activated by sending one or more electrical signals, such as one or more electrical pulses, from an automatic test equipment (ATE), such as the ATE 202 as described above to provide an example, through a wired communication link 508 onto the second switching contact 506. In the exemplary embodiment illustrated in FIG. 5A, the wired communication link 508 is mechanically connected to the second switching contact 506 using a mechanical interconnection 510, such as a solder ball or other suitable mechanical interconnection, such as silver conductive epoxy to provide an example, that will be recognized by those skilled in the relevant art(s) without departing from the spirit and scope of the present disclosure. During operation, the one or more electrical signals traverse from wired communication link 508 through the second switching contact 506 to electrically activate the mechanical push button switch 502. This electrical activation of the mechanical push button switch 502 simulates physical activation, for example, pushing, of the actuator.

FIG. 5B graphically illustrates an exemplary electrical activation of a mechanical push button switch 512. As illustrated in FIG. 5B, the mechanical push button switch 512 includes the first switching contact 504, the second switching contact 506, and the third contact having an actuator as described above. In the exemplary embodiment illustrated in FIG. 5B, the mechanical push button switch 512 can be electrically activated by sending the one or more electrical signals from the ATE through the wired communication link 508 onto the first switching contact 504. In the exemplary embodiment illustrated in FIG. 5B, the wired communication link 508 is mechanically connected to the first switching contact 504 using a mechanical interconnection 514, such as a solder ball or other suitable mechanical interconnection, such as silver conductive epoxy to provide an example, that will be recognized by those skilled in the relevant art(s) without departing from the spirit and scope of the present disclosure. During operation, the one or more electrical signals traverse from wired communication link 508 through the first switching contact 504 to electrically activate the mechanical push button switch 512. This electrical activation of the mechanical push button switch 512 simulates physical activation, for example, pushing, of the actuator.

Exemplary Operation of the Remote Control Device Testing Environment

FIG. 6 illustrates a flowchart of an exemplary operation of the remote control device testing environment according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 600 to evaluate operational performance of physical implementations of remote control devices, such as the one or more remote control devices 122 as described above in FIG. 1.

At operation 602, the operational control flow 600 physically separates a mechanical chassis of a remote control device under test (RCUT), such as one or more of the one or more remote control devices 122 as described above in FIG. 1. For example, the operational control flow 600 physically separates the second mechanical chassis 304 from the first mechanical chassis 302 as described above in FIG. 2. This separation of the mechanical chassis exposes of one or more switching contacts, such as include the first switching contacts 310.1 through 310.$n$ and/or the second switching contacts 312.1 through 312.$n$ as described above in FIG. 3, of one or more mechanical push button switches, such as the mechanical push button switches 308.1 through 308.$n$ to provide an example, within the RCUT.

At operation 604, the operational control flow 600 mechanically connects the RCUT of operation 602 to automated test equipment, such as the ATE 202 as described above in FIG. 2. The operational control flow 600 mechanically and electrically connects one or more wired communication links, such as one or more of the wired communication links 218.1 through 218.$n$ as described above in FIG. 2 to provide an example, to the one or more switching contacts exposed in operation 602. The operational control flow 600 can solder the one or more wired communication links to the one or more switching contacts exposed in operation 602 to mechanically and electrically connect the one or more wired communication links to the one or more switching contacts exposed in operation 602. Those skilled in the art(s) will recognize other mechanisms, such as silver conductive epoxy to provide an example, are possible for mechanically and electrically coupling the one or more wired communication links to the one or more switching contacts exposed in operation 602.

At operation 606, the operational control flow 600 evaluates one or more operations of the RCUT. The operational control flow 600 sends one or more electrical signals, such as one or more electrical pulses to provide an example, to through the one or more wired communication links onto the one or more switching contacts exposed in operation 602 to configure the RCUT to perform the one or more operations.

CONCLUSION

Although the embodiments of the disclosure described herein refer specifically, and by way of example, to cable modem systems, including cable modem termination systems and cable modems, it will be readily apparent to those skilled in the relevant art(s) that the disclosure is equally applicable to satellite systems, optical communication systems, telephone wire systems, home network systems, and/or any combination thereof. It will be readily apparent to those skilled in the relevant art(s) that the disclosure is applicable to any point-to-multipoint system.

The Detailed Description referred to accompanying figures to illustrate exemplary embodiments consistent with the disclosure. References in the disclosure to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The Detailed Description is not meant to limiting. Rather, the scope of the disclosure is defined only in accordance with the following claims and their equivalents. It is to be appreciated that the Detailed Description section, and not the Abstract section, is intended to be used to interpret the claims. The Abstract section can set forth one or more, but not all exemplary embodiments, of the disclosure, and thus, are not intended to limit the disclosure and the following claims and their equivalents in any way.

The exemplary embodiments described within the disclosure have been provided for illustrative purposes and are not intended to be limiting. Other exemplary embodiments are possible, and modifications can be made to the exemplary embodiments while remaining within the spirit and scope of the disclosure. The disclosure has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software application, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software application, routines, instructions can be described herein as performing certain actions. However, it should be appreciated that such descriptions are merely for convenience and that such actions in fact result from computing devices, processors, controllers, or other devices executing the firmware, software application, routines, instructions, etc.

The Detailed Description of the exemplary embodiments fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A remote control testing environment, comprising:
    a remote control under test having a mechanical chassis and a mechanical push button switch, the mechanical push button switch including a first switching contact and a second switching contact, wherein the mechanical chassis is separable to expose the first switching contact and the second switching contact; and
    an automatic test equipment configured to execute a testing script, the testing script, when executed by the automatic test equipment, configuring the automatic test equipment to send an electrical signal to the remote control under test through a wired communication link that is configured to mechanically and electrically connect the automatic test equipment to the mechanical push button.

2. The remote control testing environment of claim 1, wherein the electrical signal is configured to electrically activate the mechanical push button switch to cause the remote control under test to perform one or more operations associated with the mechanical push button switch.

3. The remote control testing environment of claim 2, wherein the testing script, when executed by the automatic test equipment, further configures the automatic test equipment to measure one or more characteristics, parameters, or attributes associated with operational performance of the remote control under test in performing the one or more operations.

4. The remote control testing environment of claim 3, wherein the one or more characteristics, parameters, or attributes comprise:
    button press speed necessary for the mechanical push button switch to be activated before one or more commands associated with the mechanical push button switch are received by another electronic device; or
    battery-life of one or more electric batteries within the remote control under test.

5. The remote control testing environment of claim 3, wherein the automatic test equipment is further configured to compare the one or more characteristics, parameters, or attributes with an electrical design specification of the remote control under test.

6. The remote control testing environment of claim 3, wherein the automatic test equipment is further configured to measure the operational performance of the remote control by electrically activating the mechanical push button switch more times per second when compared to physically pushing the mechanical push button switch.

7. The remote control testing environment of claim 1, wherein the remote control under test is exposed to environmental factors when the testing script is executed by the automatic test equipment.

8. The remote control testing environment of claim 2, wherein the testing script comprises a sequence of instructions and one or more parameters to be used by the sequence of instructions to evaluate the one or more operations.

9. The remote control testing environment of claim 8, wherein the one or more parameters indicate one or more mechanical push button switches to be activated to perform the one or more operations.

10. The remote control testing environment of claim 9, wherein the one or more operations comprise:
one or more handshaking procedures between the remote control under test and one or more electronic devices.

11. A remote control, comprising:
a user interface having a plurality of mechanical push button switches, a mechanical push button switch from among the plurality of mechanical push button switches including a first switching contact and a second switching contact;
a mechanical chassis configured to be separable to expose the first switching contact and the second switching contact; and
a processor configured to configure the remote control to perform an operation associated with the mechanical push button switch in response to receiving an electrical signal from the first switching contact or the second switching contact via a wired communication link that is configured to mechanically and electrically connect to the first switching contact or the second switching contact.

12. The remote control of claim 11, wherein the wired communication link is soldered to the first switching contact or the second switching contact.

13. The remote control of claim 11, wherein the mechanical chassis comprises:
a first mechanical chassis including the first switching contact and the second switching contact; and
a second mechanical chassis, including a third switching contact and an actuator of the mechanical push button switch, displaced from the first mechanical chassis to expose the first switching contact and the second switching contact,
wherein the mechanical chassis is separable into the first mechanical chassis and the second mechanical chassis to expose the first switching contact and the second switching contact.

14. The remote control of claim 11, wherein the electrical signal is configured to simulate physically pushing of an actuator of the mechanical push button switch.

15. The remote control of claim 11, further comprising:
a memory device that stores a mapping of the plurality of mechanical push button switches to a plurality of commands,
wherein the processor is further configured to configure the remote control to provide a command associated with the mechanical push button switch from among the plurality of commands to another electronic device.

16. The remote control of claim 11, wherein the plurality of mechanical push button switches comprises:
a programming channel selector;
a volume selector;
a keypad; or
a data pad.

17. A method for testing a remote control device under test, the method comprising:
separating a mechanical chassis of the remote control device under test to expose a first switching contact and a second switching contact of a mechanical push button switch;
receiving an electrical signal over a wired communication link that is connected to the first switching contact or the second switching contact of the mechanical push button switch, the electrical signal simulating pushing of an actuator of the mechanical push button switch; and
performing an operation associated with the mechanical push button switch in response to receiving the electrical signal.

18. The method of claim 17, further comprising:
exposing the remote control device under test to environmental factors.

19. The method of claim 17, further comprising:
measuring one or more characteristics, parameters, or attributes associated with operational performance of the remote control under test in performing the operation.

20. The method of claim 19, further comprising:
comparing the one or more characteristics, parameters, or attributes with an electrical design specification of the remote control under test.

* * * * *